United States Patent
Kitano

(10) Patent No.: US 6,980,409 B2
(45) Date of Patent: Dec. 27, 2005

(54) PROTECTIVE CIRCUIT FOR SEMICONDUCTOR DEVICE

(75) Inventor: Tohru Kitano, Tokyo (JP)

(73) Assignees: Renesas Technology Corp., Tokyo (JP); Mitsubishi Electric Engineering Co., Ltd., Tokyo (JP)

( * ) Notice: Subject to any disclaimer, the term of this patent is extended or adjusted under 35 U.S.C. 154(b) by 0 days.

(21) Appl. No.: 11/003,332

(22) Filed: Dec. 6, 2004

(65) Prior Publication Data

US 2005/0094334 A1 May 5, 2005

Related U.S. Application Data

(62) Division of application No. 10/267,876, filed on Oct. 10, 2002, now Pat. No. 6,847,512.

(30) Foreign Application Priority Data

Apr. 12, 2002 (JP) .............................. 2002-110485

(51) Int. Cl.⁷ ............................................... H02H 9/00

(52) U.S. Cl. ..................................... 361/91.1; 361/56

(58) Field of Search ............................. 361/56, 57, 58, 361/90, 91.1, 110, 111; 257/360–365

(56) References Cited

U.S. PATENT DOCUMENTS

| | | | | |
|---|---|---|---|---|
| 5,086,365 A | * | 2/1992 | Lien | 361/58 |
| 5,227,327 A | | 7/1993 | Sasaki | |
| 5,506,457 A | | 4/1996 | Krauter et al. | |
| 5,530,394 A | | 6/1996 | Blossfeld et al. | |
| 5,539,327 A | * | 7/1996 | Shigehara et al. | 326/30 |
| 5,589,702 A | | 12/1996 | Alter | |
| 5,739,998 A | * | 4/1998 | Wada | 361/56 |
| 5,854,561 A | | 12/1998 | Arimoto et al. | |
| 5,892,263 A | | 4/1999 | Tachiyama | |
| 6,014,298 A | | 1/2000 | Yu | |
| 6,194,915 B1 | * | 2/2001 | Nakayama et al. | 326/121 |
| 6,236,087 B1 | | 5/2001 | Daly et al. | |
| 6,529,536 B1 | * | 3/2003 | Taguchi | 372/38.07 |
| 6,583,475 B2 | | 6/2003 | Makita et al. | |

* cited by examiner

Primary Examiner—Stephen W. Jackson
Assistant Examiner—Danny Nguyen
(74) Attorney, Agent, or Firm—Buchanan Ingersoll PC

(57) ABSTRACT

A high impedance can be maintained at a back gate of a MOS transistor constituting a CMOS integrated circuit when power is not supplied, and is switched to an impedance lower than the impedance in use of the CMOS integrated circuit by a switch driven by a power supply of the CMOS integrated circuit. Thus, it is possible to prevent surge breakdown and electrostatic breakdown, and to prevent occurrence of latch up breakdown.

4 Claims, 8 Drawing Sheets

US 6,980,409 B2

PROTECTIVE CIRCUIT FOR SEMICONDUCTOR DEVICE

This application is a divisional of application Ser. No. 10/267,876 filed Oct. 10, 2002 now U.S. Pat. No. 6,847,512.

BACKGROUND OF THE INVENTION

1) Field of the Invention

The present invention relates to a circuit which prevents electrostatic breakdown of MOS transistors constituting the semiconductor device (e.g. CMOS integrated circuit).

2) Description of the Related Art

In recent years, semiconductor integrated circuits are developed centering around the MOS transistor technique, and are increased in scale and speed by development of a micropatterning technique. In a present MOS integrated circuit, the following technique is dominated. The gate electrodes of a PMOS transistor and an NMOS transistor are connected to each other to be an input terminal, and both the drain electrodes are connected to each other to be an output terminal, so that a complementary MOS circuit (CMOS circuit) is constituted.

The gate electrode of MOS transistors constituting the CMOS circuit is formed with an electrode which is highly insulated and another electrode formed on the insulated electrode through a thin highly insulating film, and a capacitor is formed between the electrodes. Therefore, when the capacitor portion is electrically charged, a high voltage may be instantaneously applied to the outside through an electrode pad connected to the transistor. As a result, surge breakdown occurs in another transistor or the like, or the lifetime of the transistor is shortened.

In contrast to this, when a high voltage is instantaneously applied to the electrode pad connected to the transistor by a switching operation of an external mechanical switch or a semiconductor switch, the capacitor portion of the transistor is electrically charged to generate a high voltage, electrostatic breakdown may occur, or the lifetime of the transistor may be shortened.

Therefore, a countermeasure against such surge breakdown or electrostatic breakdown is an important factor in a semiconductor integrated circuit in order to maintain a high degree of reliability of products. On the other hand, due to shrinkage and micropatterning of a semiconductor integrated circuit in recent years, the countermeasure against the electrostatic breakdown cannot be easily carried out.

A countermeasure against electrostatic breakdown which is employed in a conventional semiconductor integrated circuit (semiconductor device) will be described below with reference to FIGS. 10 and 11. FIG. 10 is a circuit diagram which shows an example of a semiconductor device subjected to a conventional countermeasure against electrostatic breakdown. FIG. 11 is a sectional structural view which explains an operation of the semiconductor device shown in FIG. 10.

In FIG. 10, a method of a countermeasure against electrostatic breakdown for an NMOS transistor circuit is shown. In FIG. 10, an NMOS transistor 101 has a drain electrode D connected to an electrode pad 102, and a source electrode S and a back gate B connected to ground (GND).

A surge protection circuit 103 is arranged on a connection line between the drain electrode D and the electrode pad 102 of the NMOS transistor 101. The surge protection circuit 103 is constituted by a series circuit composed of two diodes D11 and D12. The diode D11 has a cathode connected to a power supply 104 and an anode connected to the connection line. The diode D12 has a cathode connected to the connection line and an anode connected to the ground (GND).

With this configuration, when a positive surge voltage is applied to the electrode pad 102, an electric current is conducted to the diode D11, and a surge current flows toward the power supply 104. For this reason, a current flowing to the drain electrode D of the NMOS transistor 101 becomes small. When a negative surge voltage is applied to the electrode pad 102, an electric current is conducted to the diode D12, and a surge current flows from the ground (GND) to the electrode pad 102. For this reason, a current flowing out of the drain electrode D of the NMOS transistor 101 becomes small. Therefore, the NMOS transistor 101 is not broken down, and surge breakdown is prevented.

However, as shown in FIG. 11, a $P^+$ diffusion layer 111 on which the back gate B of the NMOS transistor 101 is formed is connected to the ground (GND). For this reason, when the input impedance of the NMOS transistor 101 on the basis of the electrode pad 102 is lower than that of the surge protection circuit 103, a surge current penetrates a junction surface between an N diffusion layer 112 in which the drain electrode D is formed and a $P^-$ well 113, passes through the $P^+$ diffusion layer 111 and a $P^-$ substrate 114, and reaches the ground (GND) to cause electrostatic breakdown of the junction surface.

For this reason, in a conventional art, a transistor size is increased to increase a reverse withstand voltage between the N diffusion layer 112 in which the drain electrode D is formed and the $P^-$ well 113, so as to prevent the electrostatic breakdown. However, a reduction of a transistor size by reducing the chip size and micropatterning of processes according to the reduction makes the thickness of the N diffusion layer 112 in which the drain electrode D is formed further smaller. Therefore, it is difficult to obtain a sufficient surge withstand voltage.

The applicant of this application has developed a semiconductor device which can prevent electrostatic breakdown even though the semiconductor device is constituted by sufficiently micropatterned MOS transistors, and has applied the semiconductor in advance (undisclosed: Japanese Patent Application No. 2001-3501). The outline of the semiconductor device will be described below with reference to FIGS. 7A and 7B. FIGS. 7A and 7B are circuit diagrams which show the configuration of a semiconductor device, subjected to the countermeasure against electrostatic breakdown, which was applied by the applicant in advance.

FIGS. 7A and 7B show extracted MOS transistors constituting a CMOS integrated circuit. More specifically, FIG. 7A shows an example of a configuration in which a PMOS transistor is subjected to a countermeasure against electrostatic breakdown. FIG. 7B is an example of a configuration in which an NMOS transistor is subjected to a countermeasure against electrostatic breakdown.

In FIG. 7A, a PMOS transistor 21 has a source electrode S connected to a power supply 24 and a drain electrode D connected to an electrode pad 22. A surge protection circuit 23 is arranged for the PMOS transistor 21.

The surge protection circuit 23 is constituted by a series circuit composed of two diodes D1 and D2. The diode D1 has a cathode connected to the power supply 24. The diode D2 has an anode connected to the ground (GND). The anode of the diode D1 and the cathode of the diode D2 are commonly connected to the connection line between the drain electrode D and the electrode pad 22 of the PMOS transistor 21.

In this configuration, in order to make the input impedance of the PMOS transistor 21 on the basis of the electrode pad 22 higher than the input impedance of the surge protection circuit 23, a resistor 25 is arranged between the back gate B of the PMOS transistor 21 and the power supply 24.

Therefore, when a surge voltage is applied to the electrode pad 22, a surge current can be prevented by the resistor 25 from flowing through the back gate B of the PMOS transistor 21, and the electrostatic breakdown and short lifetime of the PMOS transistor 21 can be prevented.

In FIG. 7B, an NMOS transistor 31 has a drain electrode D connected to an electrode pad 32 and a source electrode S connected to the ground (GND). A surge protection circuit 33 is arranged for the NMOS transistor 31.

The surge protection circuit 33 is constituted by a series circuit composed of two diodes D3 and D4. The diode D3 has a cathode connected to a power supply 24. The diode D4 has an anode connected to the ground (GND). The anode of the diode D3 and the cathode of the diode D4 are commonly connected to the connection line between the drain electrode D of the NMOS transistor 31 and the electrode pad 32.

In this configuration, in order to make the input impedance of the NMOS transistor 31 on the basis of the electrode pad 32 higher than the input impedance of the surge protection circuit 33, a resistor 35 is arranged between the back gate B of the NMOS transistor 31 and the ground (GND).

Therefore, when a surge voltage is applied to the electrode pad 32, a surge current can be prevented by the resistor 35 from flowing through the back gate B of the NMOS transistor 31, and the electrostatic breakdown and short lifetime of the NMOS transistor 31 can be prevented.

However, when design is such that the back gate of the MOS transistor has a high impedance, in practical use in which the semiconductor device is operated by applying power, a potential easily changes due to disturbance, and a parasitic element is easily formed disadvantageously. This phenomenon will be described below with reference to FIGS. 8 and 9. FIG. 8 is a sectional structural view which explains the internal configuration and operation of a CMOS integrated circuit serving as a semiconductor device shown in FIG. 7. FIG. 9 is a circuit diagram which explains a latch-up phenomenon.

As shown in FIG. 8, a CMOS circuit 40 has a structure in which the PMOS transistor 21 and the NMOS transistor 31 are complementarily connected to each other. In FIG. 8, P$^+$ diffusion layers 42 and 43 are formed on both the ends of the surface of a P$^-$ substrate 41, respectively. An N$^-$ well 46 and a P$^-$ well 47 are formed between the P$^+$ diffusion layers 42 and 43 through an N$^+$ floating layer 45.

The N$^-$ well 46 includes an N$^+$ diffusion layer 48 having the back gate B, a P diffusion layer 49 in which a source electrode S is formed, and a P diffusion layer 50 in which a drain electrode D is formed. A gate electrode G is arranged between the P diffusion layer 49 and the P diffusion layer 50. These components constitute the PMOS transistor 21.

The P$^-$ well 47 includes an N diffusion layer 51 in which a drain electrode D is formed, an N diffusion layer 52 in which a source electrode is formed, and a P$^+$ diffusion layer 53 having the back gate B. A gate electrode G is arranged between the N diffusion layer 51 and the N diffusion layer 52. These components constitute the NMOS transistor 31.

In the CMOS circuit 40, when a surge voltage is applied to the electrode pad 22, a surge current is just about flowing in the junction surface between the P diffusion layer 50 and the N$^-$ well 46 of the PMOS transistor 21. However, since the impedance of the back gate B of the PMOS transistor 21 is higher than that of the surge protection circuit 23 due to the presence of the resistor 25, the surge current flows into the surge protection circuit 23. In this manner, electrostatic breakdown of the junction surface can be prevented.

When the surge voltage is applied to the electrode pad 32, a surge current is just about flowing in the junction surface between the N diffusion layer 51 and the P$^-$ well 47 of the NMOS transistor 31. However, since the impedance of the back gate of the NMOS transistor 31 is higher than that of the surge protection circuit 33 due to the presence of the resistor 35, the surge current flows into the surge protection circuit 33. In this manner, electrostatic breakdown of the junction surface can be prevented.

However, when the back gates B of the PMOS transistor 21 and the NMOS transistor 31 have high impedance, a PNP transistor 61 and an NPN transistor 62 are easily formed as parasitic elements. The PNP transistor 61 uses the N$^-$ well layer 46 as a base, the P diffusion layer 49 of the N$^-$ well 46 as an emitter, and the P$^-$ well 47 as a collector. The NPN transistor 62 uses the P$^-$ well 47 as a base, the N diffusion layer 52 of the P$^-$ well 47 as an emitter, and the N$^-$ well 46 as a collector. These transistors are formed with the connection shown in FIG. 9.

As shown in FIG. 9, the base electrode of the PNP transistor 61 is connected to the power supply 24 through the resistor 25 together with the collector electrode of the NPN transistor 62, and the emitter electrode of the PNP transistor 61 is directly connected to the power supply 24. The base electrode of the NPN transistor 62 is connected to the ground (GND) through the resistor 35 together with the collector electrode of the PNP transistor 61, and the emitter electrode of the NPN transistor 62 is directly connected to the ground (GND).

More specifically, the PNP transistor 61 and the NPN transistor 62 constitute thyristors having a positive feedback. When the current gains of these transistors satisfy a certain condition and an electric current is conducted to one of the transistors, a large current flows between the power supply 24 and the ground (GND) through the junction surface, and a latch-up phenomenon which breaks down the element occurs. Therefore, the high impedance of the back gates B of the PMOS transistor 21 and the NMOS transistor 31 decrease a latch-up tolerance.

SUMMARY OF THE INVENTION

It is an object of this invention to provide an electrostatic breakdown prevention circuit for a semiconductor device which can prevent occurrence of latch up and electrostatic breakdown of a semiconductor device which is a micropatterned semiconductor integrated circuit.

The electrostatic breakdown prevention circuit for a semiconductor device according to one aspect of this invention includes an impedance applying unit which applies an impedance to a back gate of a MOS transistor constituting a CMOS integrated circuit, and a switch which is driven by a power supply of the CMOS integrated circuit and which performs a switching operation such that the impedance applied by the impedance applying unit is switched to an impedance lower than the impedance in use of the CMOS integrated circuit.

According to this invention, the high impedance is maintained at the back gate when the power is not supplied, and is switched to an impedance lower than the impedance by the switch when the power is supplied. Thus, it is possible to prevent surge breakdown and electrostatic breakdown, and to prevent occurrence of latch up breakdown.

The electrostatic breakdown prevention circuit for a semiconductor device according to another aspect of this invention includes an impedance applying unit which applies an impedance to a back gate of a MOS transistor constituting a CMOS integrated circuit, a switch which is driven by a power supply of the CMOS integrated circuit and which performs a switching operation such that the impedance applied by the impedance applying unit is switched to an impedance lower than the impedance in use of the CMOS integrated circuit, and a delay unit which delays the switching operation of the switch to the lower impedance for a certain period of time when a power supply potential of the CMOS integrated circuit temporarily rises.

According to this invention, even if only a single power supply is disposed, provision of the delay unit makes it possible to prevent surge breakdown and electrostatic breakdown when the power is not supplied, and to prevent latch up breakdown when the power is supplied.

These and other objects, features and advantages of the present invention are specifically set forth in or will become apparent from the following detailed descriptions of the invention when read in conjunction with the accompanying drawings.

DETAILED DESCRIPTION

Embodiments of the electrostatic breakdown prevention circuit for a semiconductor device according to the present invention will be described in detail below with reference to the accompanying drawings.

Figure 1A:
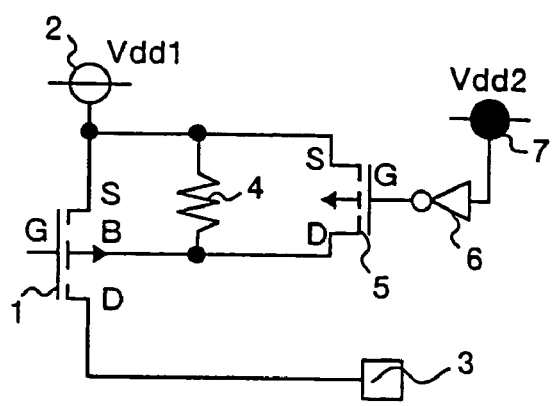
FIGS. 1A to 1C are diagrams which show configurations of an electrostatic breakdown prevention circuit for a semiconductor device according to a first embodiment of the present invention.
Figure 1B:
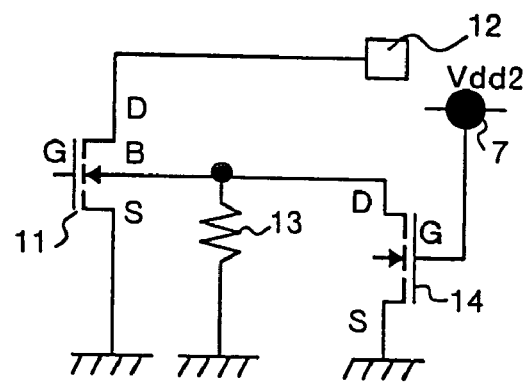
Figure 1C:
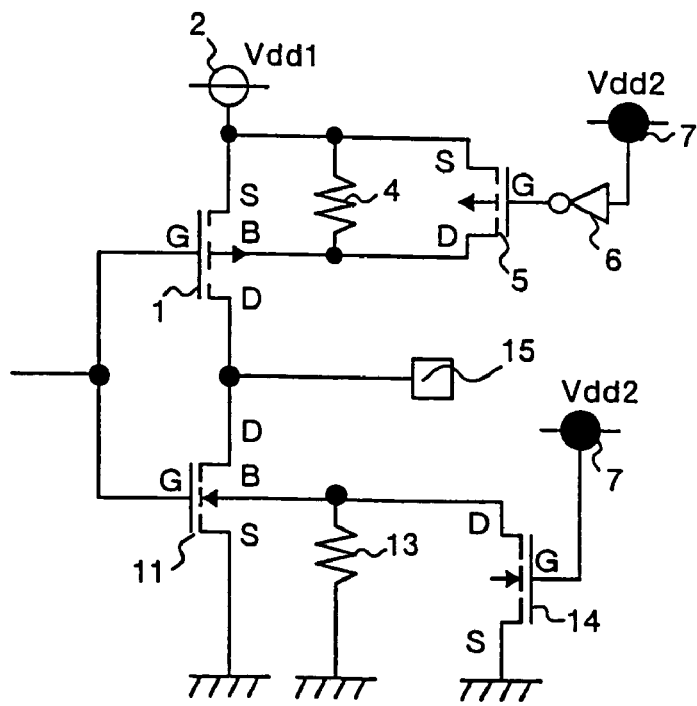

A first embodiment of this invention will be explained below. FIGS. 1A to 1C are diagrams which show the configurations of the electrostatic breakdown prevention circuit for a semiconductor device according to the first embodiment. FIG. 1A shows an example of the configuration of an electrostatic breakdown prevention circuit for a PMOS transistor of the MOS transistors constituting a CMOS integrated circuit which is a semiconductor device. FIG. 1B shows an example of the configuration of an electrostatic breakdown prevention circuit for an NMOS transistor of the MOS transistors constituting the CMOS integrated circuit which is a semiconductor device. FIG. 1C shows an example of the configuration of an electrostatic breakdown prevention circuit for a CMOS inverter used in an output circuit.

In FIG. 1A, a PMOS transistor 1 has a source electrode S connected to a power supply (Vdd1) 2 and a drain electrode D connected to an electrode pad 3. A resistor 4, a PMOS transistor 5, and an inverter 6 are arranged for the PMOS transistor 1.

One end of the resistor 4 and a drain electrode D of the PMOS transistor 5 are connected to a back gate B of the PMOS transistor 1, and the other end of the resistor 4 and a source electrode S of the PMOS transistor 5 are connected to the source electrode S of the PMOS transistor 1. A gate electrode G of the PMOS transistor 5 is connected to a power supply (Vdd2) 7 through the inverter 6.

The resistor 4 is arranged to set the back gate B of the PMOS transistor 1 to a high impedance state. The PMOS transistor 5 functions as a switch which switches and sets the impedance of the back gate B of the PMOS transistor 1 between a low impedance state and a high impedance state.

In FIG. 1B, an NMOS transistor 11 has a source electrode S connected to the ground (GND) and a drain electrode D connected to an electrode pad 12. A resistor 13 and an NMOS transistor 14 are arranged for the NMOS transistor 11.

One end of the resistor 13 and a drain electrode D of the NMOS transistor 14 are connected to the back gate B of the NMOS transistor 11. The other end of the resistor 13 and a source electrode S of the NMOS transistor 14 are connected to the ground (GND) like the source electrode S of the NMOS transistor 11. A gate electrode G of the NMOS transistor 14 is directly connected to the power supply (Vdd2) 7.

The resistor 13 is arranged to set the back gate B of the NMOS transistor 11 to a high impedance state. The NMOS transistor 14 functions as a switch which switches and sets the impedance of the back gate B of the NMOS transistor 11 between a low impedance state and a high impedance state.

In FIG. 1C, in a CMOS inverter used in an output circuit, the gate electrode G of the PMOS transistor 1 shown in FIG. 1A and the gate electrode G of the NMOS transistor 11 shown in FIG. 1B are connected to each other to be an input terminal, and the drain electrode D of the PMOS transistor 1 and the drain electrode D of the NMOS transistor 11 are connected to each other to be an output terminal. The output terminal is connected to a common electrode pad 15.

The power supply (Vdd1) 2 and the power supply (Vdd2) 7 are independent power supplies. More specifically, for example, the CMOS integrated circuit which is the semiconductor device has a terminal for the power supply (Vdd1) 2 and a terminal for the power supply (Vdd2) 7 as power supply input terminals. As a power supply of the inverter 6 shown in FIG. 1A, the power supply (Vdd1) 2 is not used, but the power supply (Vdd2) 7 is used.

Figure 2:
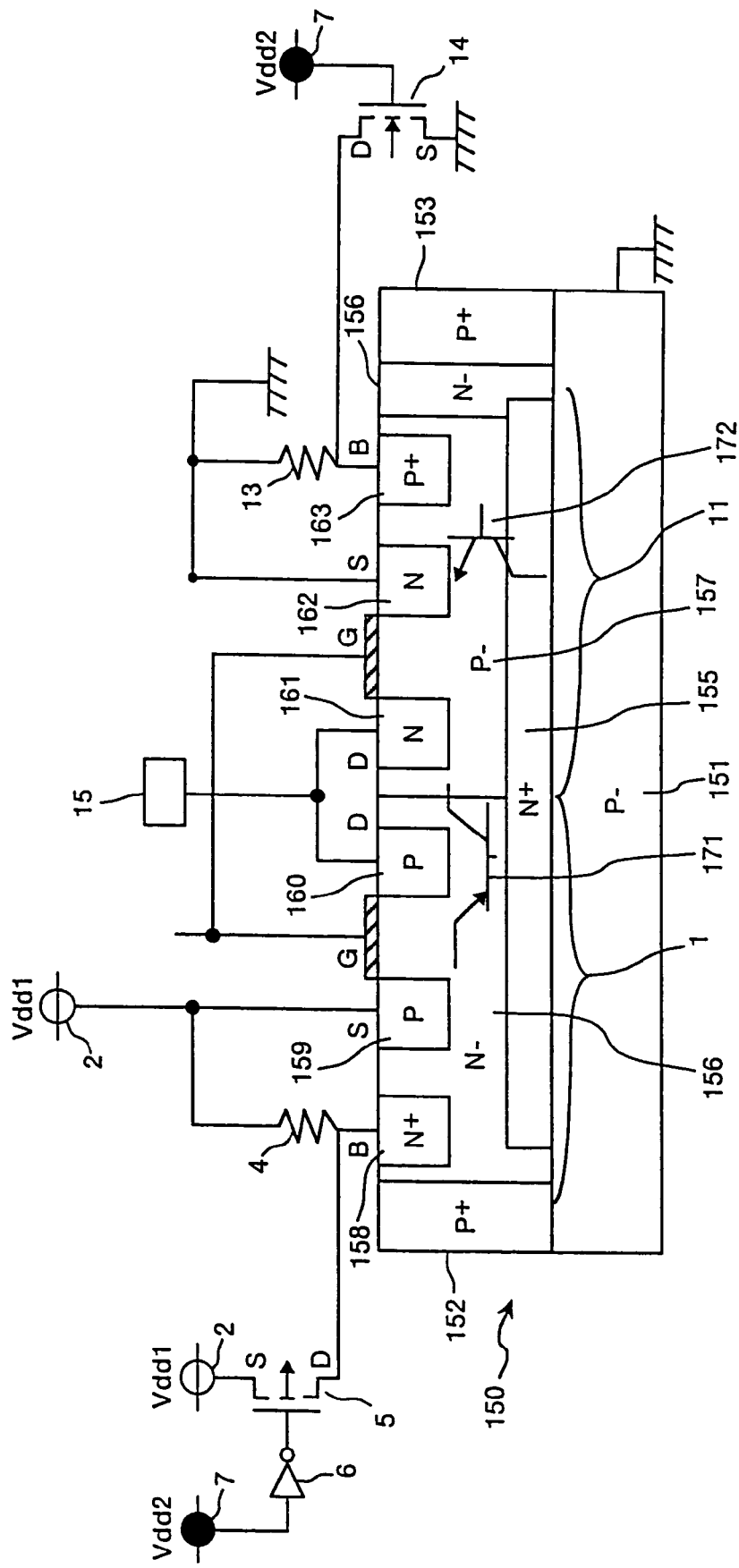
FIG. 2 is a sectional structural view which explains the internal configuration of a CMOS inverter shown in FIG. 1C and the operation of the electrostatic breakdown prevention circuit.
Figure 3:
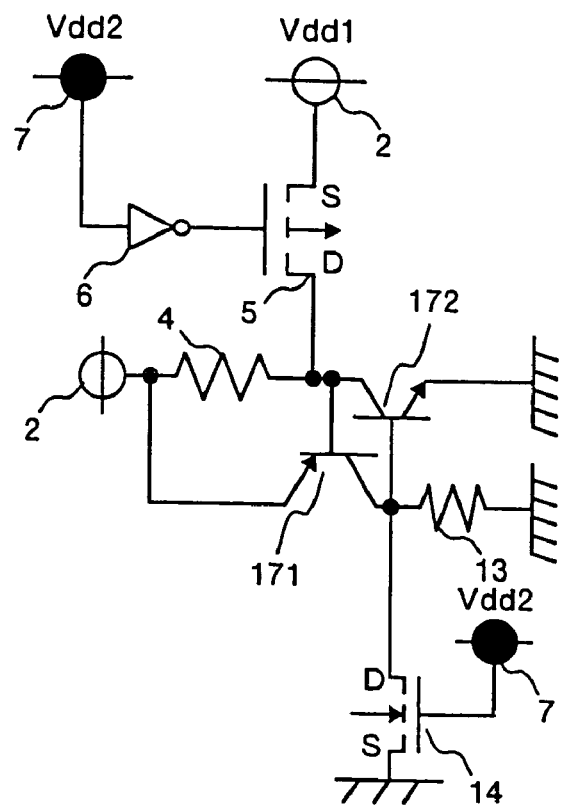
FIG. 3 is a diagram which explains suppression of a thyristor operation by the electrostatic breakdown prevention circuit for the semiconductor device shown in FIG. 1, FIGS. 4A and 4B are diagrams which show configurations of an electrostatic breakdown prevention circuit for a semiconductor device according to a second embodiment of the present invention.

The operation of the electrostatic breakdown prevention circuit for a semiconductor device according to the first embodiment will be described below with reference to FIG. 1A to FIG. 3. FIG. 2 is a sectional structural view which explains the internal configuration of the CMOS inverter shown in FIG. 1C and the operation of the electrostatic breakdown prevention circuit. FIG. 3 is a diagram which explains suppression of a thyristor operation by the electrostatic breakdown prevention circuit of the semiconductor device shown in FIG. 1.

The internal configuration of the CMOS inverter will be described below. As shown in FIG. 2, a CMOS inverter 150 has a structure in which the PMOS transistor 1 and the NMOS transistor 11 are complementarily connected to each other. In FIG. 2, $P^+$ diffusion layers 152 and 153 are formed on both the ends of the surface of a $P^-$ substrate 151, respectively. An $N^-$ well 156 and a $P^-$ well 157 are formed between the $P^+$ diffusion layers 152 and 153 through an $N^+$ floating layer 155.

The $N^-$ well 156 includes an $N^+$ diffusion layer 158 having the back gate B, a P diffusion layer 159 in which a source electrode S is formed, and a P diffusion layer 160 in which a drain electrode D is formed. A gate electrode G is arranged between the P diffusion layer 159 and the P diffusion layer 160. These components constitute the PMOS transistor 1.

The $P^-$ well 157 includes an N diffusion layer 161 in which a drain electrode D is formed, an N diffusion layer 162 in which a source electrode is formed, and a $P^+$ diffusion layer 163 having the back gate B. A gate electrode G is arranged between the N diffusion layer 161 and the N diffusion layer 162. These components constitute the NMOS transistor 11. The P diffusion layer 160 of the PMOS transistor 1 and the N diffusion layer 161 of the NMOS transistor 11 are connected to the electrode pad 15.

The gate electrode G of the PMOS transistor 1 and the gate electrode G of the NMOS transistor 11 are commonly connected to each other. In the PMOS transistor 1, the drain electrode D of the PMOS transistor 5 is connected to the $N^+$ diffusion layer 158 having the back gate B, and connected to the power supply (Vdd1) 2 and the P diffusion layer 159 having the source electrode S through the resistor 4.

In the NMOS transistor 11, the drain electrode D of the NMOS transistor 14 is connected to the $P^+$ diffusion layer 163 having the back gate B, and connected to the ground (GND) and the N diffusion layer 162 having the source electrode S through the resistor 13.

FIG. 2 shows that the PNP transistor 61 and the NPN transistor 62 are formed as parasitic elements. A PNP transistor 171 uses the $N^-$ well layer 156 as a base, the P diffusion layer 159 of the $N^-$ well 156 as an emitter, and the $P^-$ well 157 as a collector. An NPN transistor 172 uses the $P^-$ well 157 as a base, the N diffusion layer 162 of the $P^-$ well 157 as an emitter, and the $N^-$ well 156 as a collector. These parasitic transistors, the PMOS transistor 5, and the NMOS transistor 14 are related to each other as shown in FIG. 3.

In FIG. 3, the base electrode of the PNP transistor 171 is connected to the power supply 2 through the resistor 4 together with the collector electrode of the NPN transistor 172 and connected to the drain electrode D of the PMOS transistor 5. The emitter electrode of the PNP transistor 171 is directly connected to the power supply 2. The base electrode of the NPN transistor 172 is connected to the ground (GND) through the resistor 13 together with the collector electrode of the PNP transistor 171 and connected to the drain electrode D of the NMOS transistor 14. The emitter electrode of the NPN transistor 172 is directly connected to the ground (GND).

More specifically, the PNP transistor 171 and the NPN transistor 172 constitute thyristors having a positive feedback. These base potentials can be controlled by the PMOS transistor 5 and the NMOS transistor 14.

In FIG. 1A to FIG. 3, when disturbance such as a surge voltage is applied to the electrode pad 3 if no power is applied to the CMOS integrated circuit as the semiconductor device, the voltage at the power supply (Vdd1) 2 may become temporarily high by a diode formed between the drain electrode D and the back gate B.

In this instance, the power supply (Vdd2) 7 which is the drive power supply of the PMOS transistor 5 is different from the power supply (Vdd1) 2. For this reason, the PMOS transistor 5 is not in an ON state, and is reliably in an OFF state even in a period in which the voltage of the power supply (Vdd1) 2 is temporarily high. The inverter 6 shown in FIG. 1A does not use the power supply (Vdd1) 2 to reliably perform the above operation.

Therefore, when the voltage of the power supply (Vdd1) 2 is temporarily high, in the PMOS transistor 1, the back gate B is set in a high impedance state by the resistor 4. For this reason, even when there is disturbance such that a surge voltage is applied in transportation or packaging of the semiconductor device, the PMOS transistor 1 is effectively protected from electrostatic breakdown.

When the CMOS integrated circuit which is the semiconductor device is turned on, the PMOS transistor 5 and the NMOS transistor 14 are set in ON states, and the back gates B of the PMOS transistor 1 and the NMOS transistor 11 have low impedances. Therefore, as shown in FIG. 3, since the base-emitter voltages of the PNP transistor 171 and the NPN transistor 172 serving as parasitic elements are suppressed from being increased, these transistors are suppressed from being operated as thyristors, and a latch-up phenomenon is prevented from occurring.

As described above, according to the first embodiment, when the power supply is in an OFF state, the impedance of the back gate is kept high. When the power supply is turned on, the impedance of the back gate is switched to a low impedance. For this reason, surge breakdown and electrostatic breakdown can be prevented, and latch-up breakdown can also be prevented.

Figure 4A:
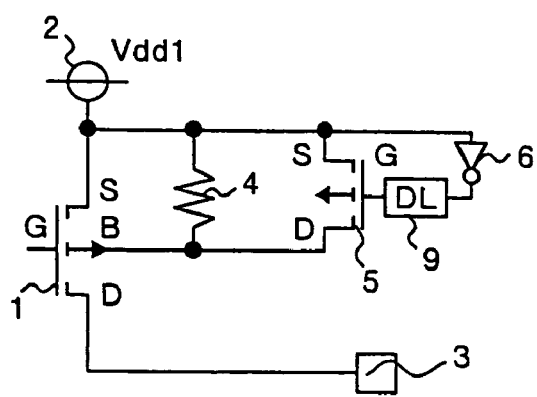
Figure 4B:
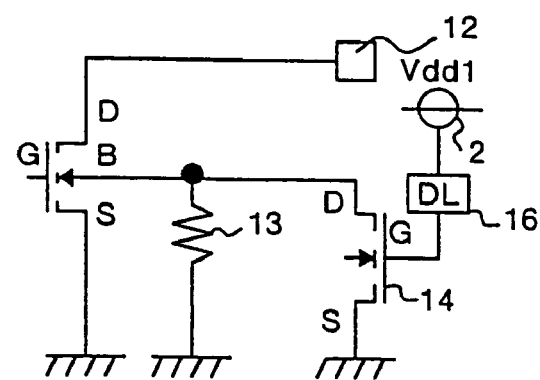

A second embodiment of this invention will be explained below. FIGS. 4A and 4B are diagrams which show the configuration of an electrostatic breakdown prevention circuit for a semiconductor device according to the second embodiment. FIG. 4A shows an example of a configuration of an electrostatic breakdown prevention circuit for a PMOS transistor of the MOS transistors constituting a CMOS integrated circuit which is a semiconductor device. FIG. 4B shows an example of a configuration of an electrostatic breakdown prevention circuit for an NMOS transistor of the MOS transistors constituting a CMOS integrated circuit which is a semiconductor device. A CMOS inverter corresponding to the CMOS inverter shown in FIG. 1C is omitted in FIGS. 4A and 4B.

The same reference numerals as in the first embodiment (FIG. 1) denote the same parts or similar parts as those shown in FIGS. 4A and 4B. Parts related to the second embodiment will be mainly described here.

As shown in FIGS. 4A and 4B, in the second embodiment, delay circuits (DL) 9 and 16 are arranged in the configuration described in the first embodiment (FIG. 1). Therefore, a single power supply (Vdd1) 2 is used as a power supply.

In FIG. 4A, the delay circuit (DL) 9 is arranged between the output terminal of an inverter 6 and a gate electrode G of a PMOS transistor 5. The delay circuit (DL) 16 is arranged between the power supply (Vdd1) 2 and a gate electrode G of an NMOS transistor 14.

Each of the delay circuits (DL) 9 and 16 is constituted by a resistor and a capacitor. The delay circuits (DL) 9 and 16 are arranged for the following reason. That is, when the power supply (Vdd1) 2 temporarily changes to a high potential, the PMOS transistor 5 and the NMOS transistor 14 can be reliably maintained in OFF states within a predetermined period.

In the second embodiment, in a power-on state, the same operation as that in the first embodiment is performed, and a description thereof will be omitted. An operation performed when the power supply (Vdd1) 2 temporarily changes to a high potential in a power-off state will be explained.

Disturbance such as a surge voltage is applied to an electrode pad 3 when the power supply of the CMOS integrated circuit is in an OFF state. When the voltage of the power supply (Vdd1) 2 is temporarily high, the delay circuit (DL) 9 delays the potential of the power supply (Vdd1) 2 such that the gate potential of the PMOS transistor 5 gradually reaches a low level, and the delay circuit (DL) 16 delays the potential of the power supply (Vdd1) 2 such that the gate potential of the NMOS transistor 14 gradually reaches a high level, so that the gate potentials are transmitted to the gate electrode G of the PMOS transistor 5 and the NMOS transistor 14.

When the delay times of the delay circuits (DL) 9 and 16 are sufficiently longer than a disturbance apply time, a voltage which turns on the PMOS transistor 5 and the NMOS transistor 14 is not applied to the gate electrode G of the PMOS transistor 5 and the NMOS transistor 14. Therefore, even though the same power supply(Vdd1) 2 as the power supply for the PMOS transistor 1 to be protected is used as the drive power supply of the PMOS transistor 5 and the NMOS transistor 14, the PMOS transistor 5 and the NMOS transistor 14 can be reliably maintained in an OFF state in a period in which the power supply voltage is temporarily high. More specifically, when the CMOS integrated circuit serving as a semiconductor device is not in an OFF state, the impedances of the back gates B of the PMOS transistor 1 and the NMOS transistor 11 can be reliably set to be high.

In this manner, according to the second embodiment, the delay circuits are arranged. For this reason, even though a single power supply is used, as in the first embodiment, surge breakdown and electrostatic breakdown can be prevented in an OFF state, and latch-up breakdown can be prevented in an ON state.

Figure 5A:
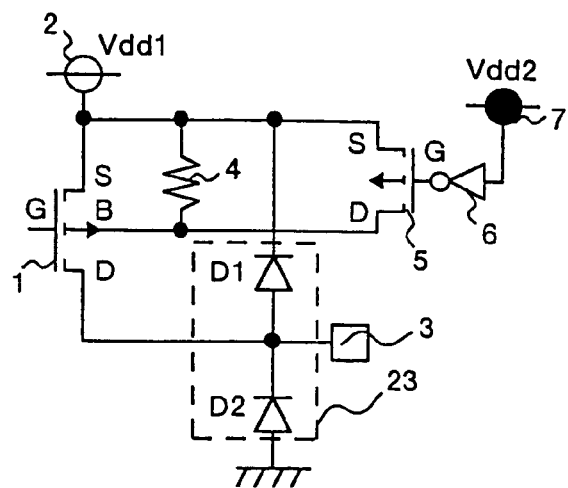
FIGS. 5A and 5B are diagrams which show configurations of an electrostatic breakdown prevention circuit for a semiconductor device according to a third embodiment of the present invention.
Figure 5B:
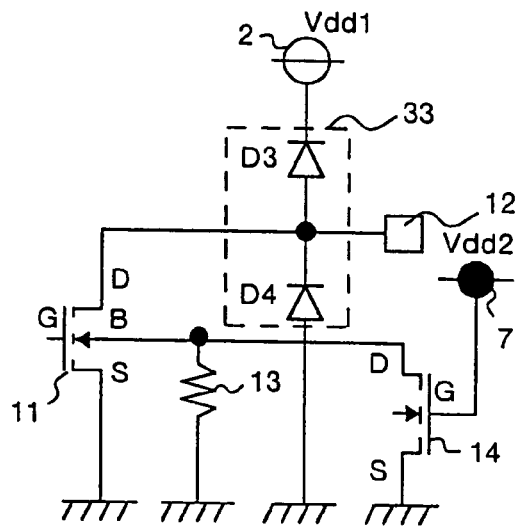

A third embodiment of this invention will be explained below. FIGS. 5A and 5B are diagrams which show configurations of an electrostatic breakdown prevention circuit for a semiconductor device according to the third embodiment. FIG. 5A shows an example of a configuration of an electrostatic breakdown prevention circuit for a PMOS transistor of the MOS transistors constituting a CMOS integrated circuit which is a semiconductor device. FIG. 5B is an example of a configuration of an electrostatic breakdown prevention circuit for an NMOS transistor of the MOS transistors constituting a CMOS integrated circuit which is a semiconductor device. A CMOS inverter corresponding to the CMOS inverter shown in FIG. 1C is omitted in FIGS. 5A and 5B.

The same reference numerals as in the first embodiment (FIG. 1) denote the same parts or similar parts in FIGS. 5A and 5B. Parts related to the third embodiment will be mainly described here.

Figure 7A:
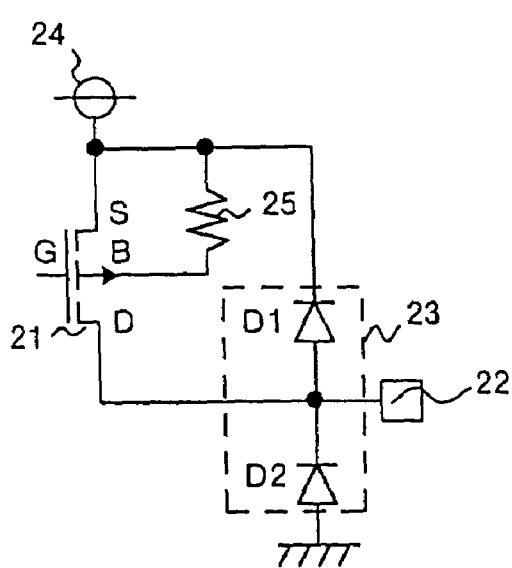
FIGS. 7A and 7B are diagrams which show the configuration of a semiconductor device subjected to a countermeasure against electrostatic breakdown which was applied by the applicant of this application in advance.
Figure 7B:
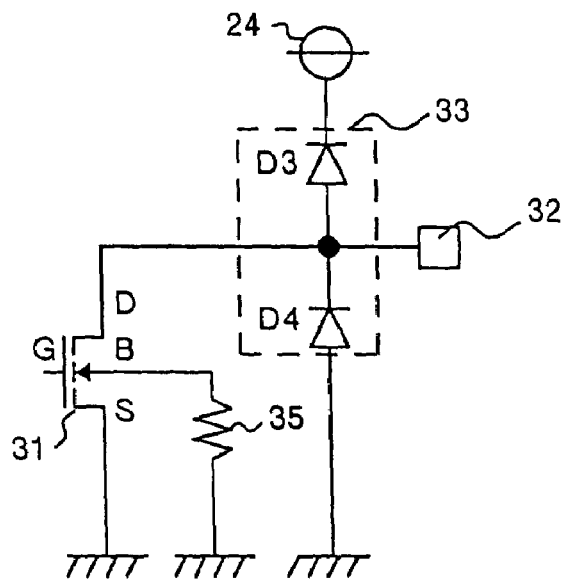
Figure 8:
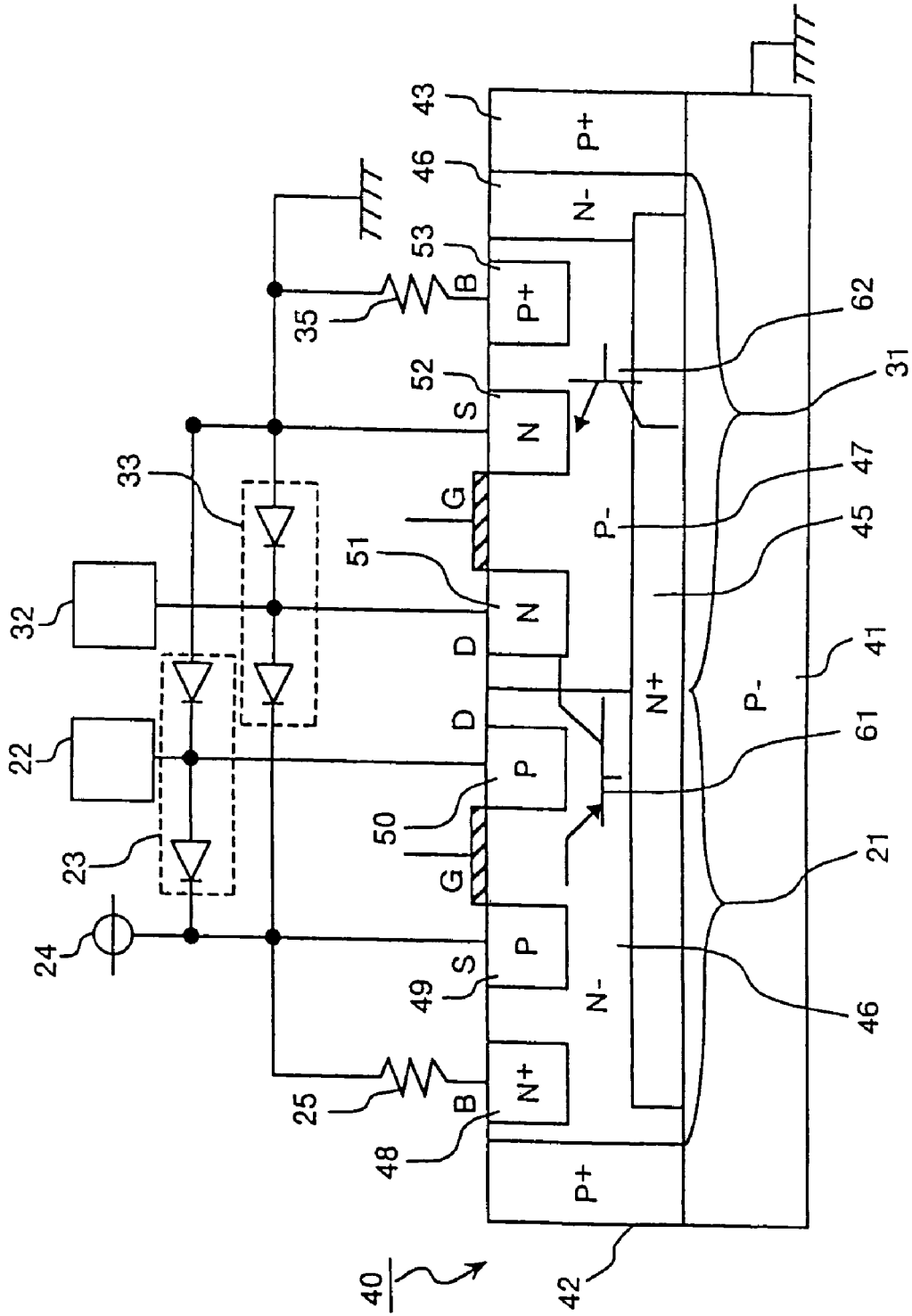
FIG. 8 is a sectional structural view which explains the operation of the semiconductor device shown in FIG. 7.
Figure 9:
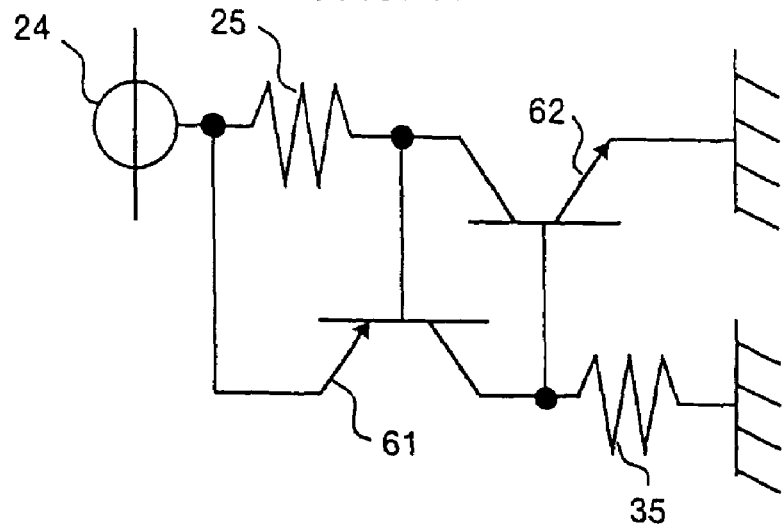
FIG. 9 is a circuit diagram which explains a latch-up phenomenon.
Figure 10:
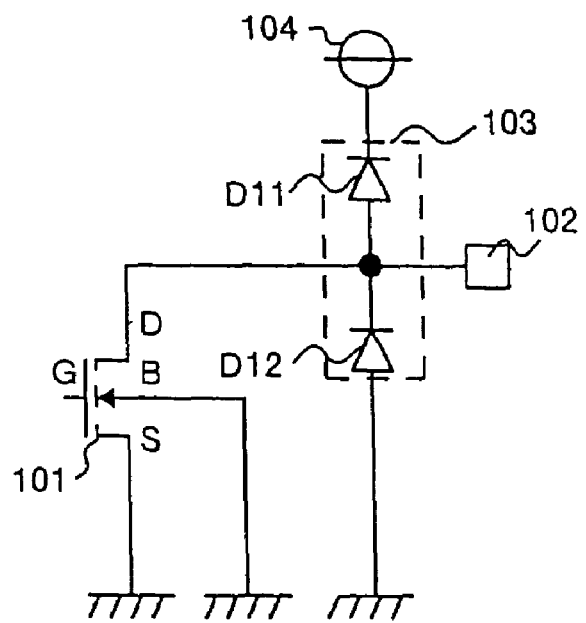
FIG. 10 is a circuit diagram which shows an example of a semiconductor device subjected to a conventional countermeasure against electrostatic breakdown.
Figure 11:
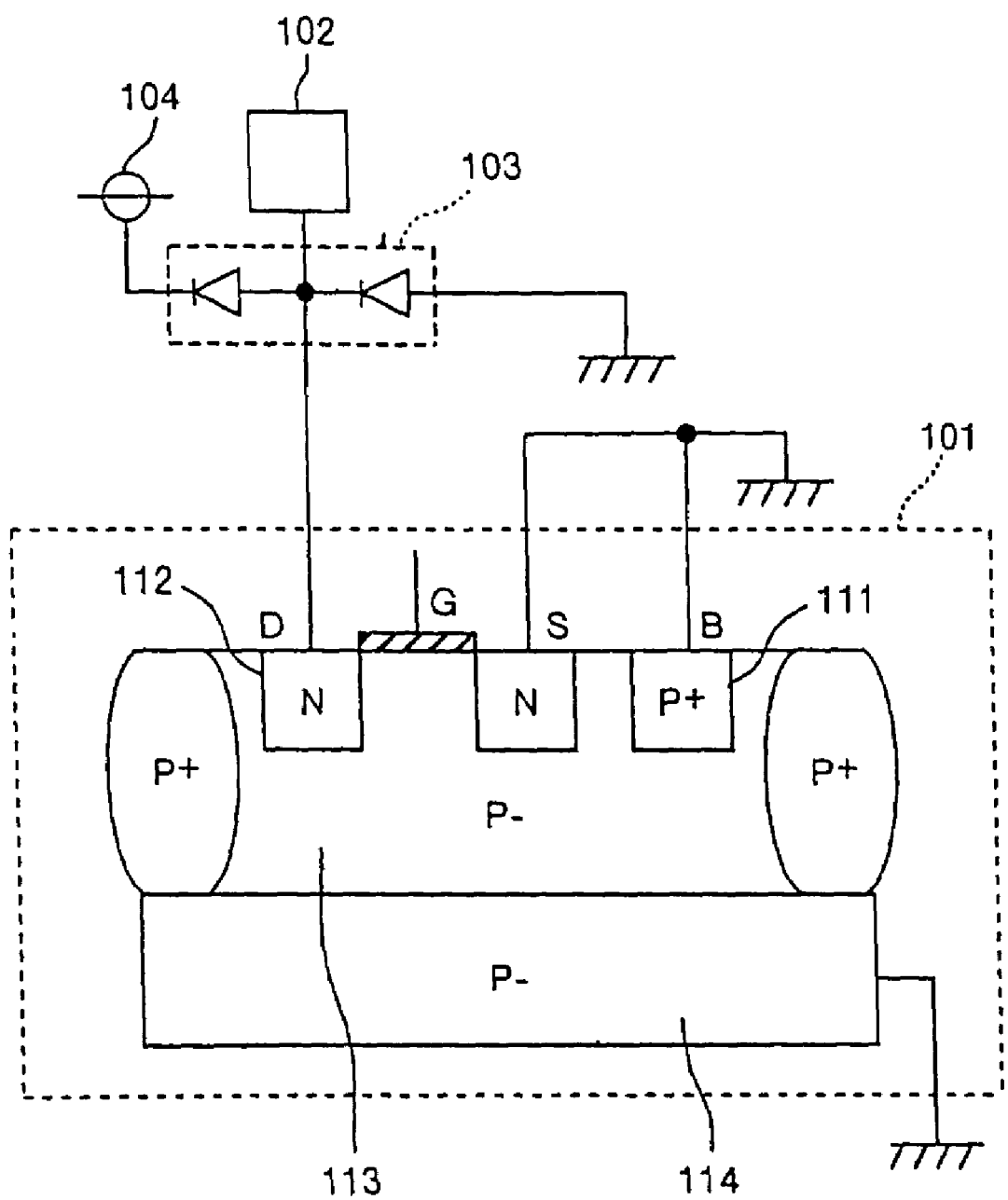
FIG. 11 is a sectional structural view which explains an operation of the semiconductor device shown in FIG. 10.

As shown in FIGS. 5A and 5B, in the third embodiment, surge protection circuits 23 and 33 each having a diode configuration shown in a conventional art (in FIG. 10) are arranged in the configuration described in the first embodiment (FIG. 1). The third embodiment can be an example of an application (part 1) to the semiconductor device, shown in FIGS. 7A and 7B, which is applied by the applicant in advance.

In FIG. 5A, the surge protection circuit 23 is constituted by a series circuit of two diodes D1 and D2, and the forward terminal of the series circuit is connected to a power supply (Vdd1), and the backward terminal of the series circuit is connected to the ground (GND). The connection terminal of the two diodes D1 and D2 is connected to the connection line between a drain electrode D and an electrode pad 3 of a PMOS transistor 1.

In FIG. 5B, the surge protection circuit 33 is constituted by two diodes D3 and D4, the forward terminal of the series circuit is connected to a power supply (Vdd1), and the backward terminal of the series circuit is connected to the ground (GND). The connection terminal of the two diodes D3 and D4 is connected to the connection line between a drain electrode D and an electrode pad 12 of an NMOS transistor 11.

With this configuration, when disturbance such as a surge voltage is applied to the electrode pads 3 and 12, the diodes D1 and D3 perform ON operations, a surge current flows into a power supply (Vdd1) 2 through the diodes D1 and D3. For this reason, loads on the PMOS transistor 1 and the NMOS transistor 11 are reduced, thus a tolerance can be increased.

Therefore, according to the third embodiment, as in the first embodiment, surge breakdown and electrostatic breakdown can be prevented in an OFF state, and latch-up breakdown can be prevented in an ON state. In addition, since the surge protection circuits are arranged, the tolerance of the MOS transistor to be protected can be increased in an OFF state.

Figure 6A:
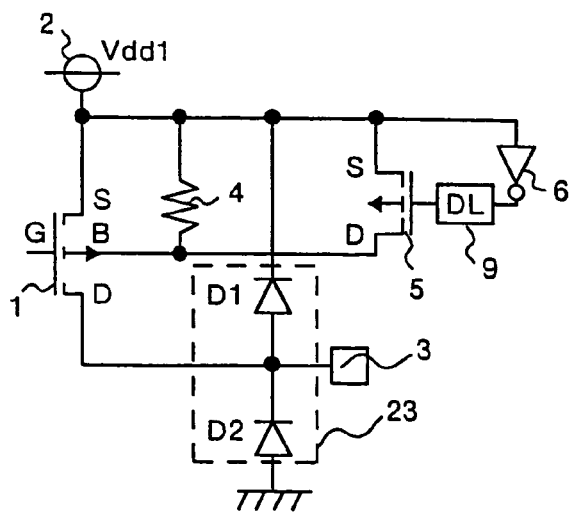
FIGS. 6A and 6B are diagrams which show configurations of an electrostatic breakdown prevention circuit for a semiconductor device according to a fourth embodiment of the present invention.
Figure 6B:
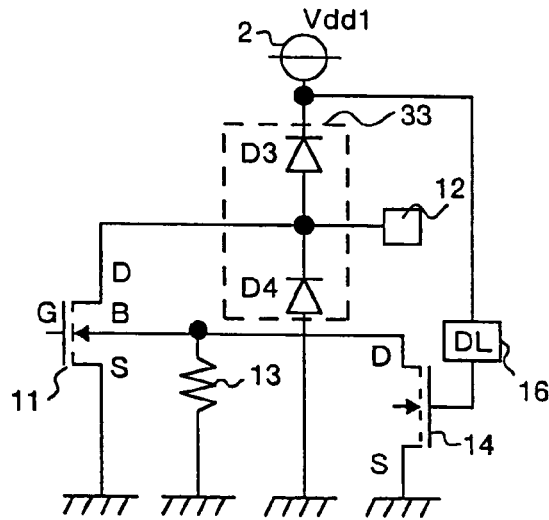

A fourth embodiment of this invention will be explained below. FIGS. 6A and 6B are diagrams which show configurations of an electrostatic breakdown prevention circuit for a semiconductor device according to the fourth embodiment. FIG. 6A shows an example of a configuration of an electrostatic breakdown prevention circuit for a PMOS transistor of the MOS transistors constituting a CMOS integrated circuit which is a semiconductor device. FIG. 6B is an example of a configuration of an electrostatic breakdown prevention circuit for an NMOS transistor of the MOS transistors constituting a CMOS integrated circuit which is a semiconductor device. A CMOS inverter corresponding to the CMOS inverter shown in FIG. 1C is omitted in FIGS. 6A and 6B.

The same reference numerals as in the second embodiment (FIG. 4) denote the same parts or similar parts in FIGS. 6A and 6B. Parts related to the fourth embodiment will be mainly described here.

As shown in FIGS. 6A and 6B, in the fourth embodiment, surge protection circuits 23 and 33 each having a diode configuration shown in a conventional art (in FIG. 10) are arranged in the configuration described in the second embodiment (FIG. 4). The fourth embodiment can be an example of an application (part 2) to the semiconductor device, shown in FIGS. 7A and 7B, which is applied by the applicant in advance.

The connection relationship between the surge protection circuits 23 and 33 is the same as that described in the third embodiment (FIG. 5). Since the operation is described in the third embodiment (FIG. 5), the operation is not described again.

Therefore, according to the fourth embodiment, as in the second embodiment, surge breakdown and electrostatic breakdown can be prevented in an OFF state, and latch-up breakdown can be prevented in an ON state. In addition, since the surge protection circuits are arranged, the tolerance of the MOS transistor to be protected can be increased in an OFF state.

As a resistor serving as an impedance applying unit described in each of the embodiments, for example, a resistor formed by a semiconductor layer or a resistor component of a wire which leads the back gate to the ground or the power supply can be used.

As has been described above, according to one aspect of the present invention, in a MOS transistor constituting a CMOS integrated circuit, a certain level of impedance is applied to the back gate by the impedance applying unit. In an OFF state, the back gate is maintained in a state of impedance at the certain level. After the power supply is turned on, the impedance applied to each of the MOS transistors by the impedance applying unit is changed into an impedance lower than the impedance by the switch driven by the power supply of the CMOS integrated circuit. Therefore, surge breakdown and electrostatic breakdown can be prevented in an OFF state, and latch-up breakdown can be prevented in an ON state.

According to another aspect of the present invention, in a MOS transistor constituting a CMOS integrated circuit, an impedance is applied to the back gate by the impedance applying unit. After the power supply is turned on, the impedance applied to each of the MOS transistors by the impedance applying unit is switched to an impedance lower than the impedance by the switch driven by the power supply of the MOS integrated circuit. On the other hand, in an OFF state, when the power supply potential of the CMOS integrated circuit is increased by disturbance, a switching operation to the lower impedance of the switch is delayed by the delay unit by a predetermined time corresponding to an application time of the disturbance. More specifically, within the predetermined time corresponding to the application time of the disturbance, the back gate is maintained in a higher-impedance state in which a higher impedance is applied by the impedance applying unit. Therefore, even though the same power supply as that of the MOS transistor to be protected is used as the power supply which drives the switch, surge breakdown and electrostatic breakdown can be prevented in an OFF state, and latch-up breakdown can be prevented in an ON state.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A protective circuit for a semiconductor device comprising:
    an electrode pad;
    a first MOS transistor which is connected between the electrode pad and a terminal of a power source;
    a second MOS transistor which is connected between the electrode pad and a ground;
    an impedance applying unit which applies a first impedance to a back gate of the second MOS transistor; and
    a switch which performance switching operation to a second impedance which is lower than the first impedance applied by the impedance applying unit after a voltage is applied to the terminal of the power source.

2. The protective circuit for a semiconductor device according to claim 1, wherein the first MOS transistor is a PMOS transistor, and the second MOS transistor is an NMOS transistor.

3. The protective circuit for a semiconductor device according to claim 1, wherein the switch comprises a MOS transistor which is connected between the back gate of the second NMOS transistor and the ground, wherein the MOS transistor become energized after the voltage is applied to the terminal of the power source.

4. The protective circuit for a semiconductor device according to claim 1, wherein the electrode pad is an output electrode pad, and both of the first MOS transistor and the second MOS transistor are output MOS transistors.

* * * * *